United States Patent [19]

Park

[11] Patent Number: 5,665,638

[45] Date of Patent: Sep. 9, 1997

[54] METHOD FOR REPAIRING A DEFECT GENERATED CELL USING A LASER

[75] Inventor: Hee Kook Park, Bubaleub, Rep. of Korea

[73] Assignee: Hyundai Electronics Industries Co., Ltd., Rep. of Korea

[21] Appl. No.: 499,672

[22] Filed: Jul. 7, 1995

[30] Foreign Application Priority Data

Jul. 7, 1994 [KR] Rep. of Korea .................. 1994-16359

[51] Int. Cl.⁶ ........................................... H01L 21/268
[52] U.S. Cl. ........................ 438/4; 257/529; 438/601; 438/940
[58] Field of Search ............................ 437/173, 922, 437/48; 148/DIG. 93, DIG. 55; 257/529

[56] References Cited

U.S. PATENT DOCUMENTS

| | | | |
|---|---|---|---|
| 4,602,420 | 7/1986 | Saito | 148/DIG. 55 |
| 4,826,785 | 5/1989 | McClure et al. | 148/DIG. 55 |

FOREIGN PATENT DOCUMENTS

| | | | |
|---|---|---|---|
| 60-91654 | 5/1985 | Japan | 148/DIG. 55 |
| 63-244644 | 10/1988 | Japan | 437/922 |
| 5-166935 | 7/1993 | Japan | 437/922 |
| 2237446 | 5/1991 | United Kingdom | 257/529 |

*Primary Examiner*—Charles L. Bowers, Jr.
*Assistant Examiner*—Leon Radomsky
*Attorney, Agent, or Firm*—Blakely Sokoloff Taylor & Zafman

[57] ABSTRACT

The invention provides a method for repairing a defect-generated cell using a laser for disconnecting a defect-generated portion of a fuse conductive line in the fabricating process of semiconductor integrated circuits, characterized in that an insulation layer on the fuse conductive line is isotropically etched partially to a predetermined thickness for the purpose of refracting laser beam incident to the defect-generated portion of the fuse conductive line.

2 Claims, 3 Drawing Sheets

METHOD FOR REPAIRING A DEFECT GENERATED CELL USING A LASER

BACKGROUND OF THE INVENTION

The present invention relates to a method for repairing a cell having a defect, which is generated during a process for fabricating semiconductor integrated circuits using a laser, and more particularly, to the method for repairing a defect-generated cell using a laser for cutting the defect-generated portion of the cell accurately.

A laser is an optical device providing a monochromatic light having strong directivity, which has been used for the repairing process in the fabricating process of semiconductor devices, since it is possible to focus energy on a minute area.

In other words, the repairing process is a method of cutting a fuse conductive line by controlling the beam energy of the laser, adjusting to the defect-generated portion of the cell for repairing the defect-generated cell. Generally, the fuse conductive line is made up of a polycrystalline silicon layer or polycide line. At this time, it should be noted the the adjacent fuse conductive line, excepting selected one, or substrate can be damaged in the case where the spot size of the laser beam is large or the energy of the laser is excessive.

FIG. 1A is a plan view illustrating alignment of the fuse conductive line and irradiation of the laser beam for repairing, according to a prior art, FIG. 1B is a cross-sectional view illustrating alignment of the fuse conductive line and irradiation of the laser beam for repairing, according to a prior art, FIG. 2A is a plan view of a damaged substrate by high power of the laser, FIG. 2B is a cross-sectional view of a damaged substrate due to the high power of a laser, and FIG. 2C is a plan view illustrating the disconnected state of a fuse conductive line which is not selected due to the misalignment of a laser beam. The prior art will be explained below with reference to the above described figures. In these figures, reference number 1 denotes the fuse conductive line, 2 the laser beam, 3 the gate oxide, 4 the substrate, 5 the isolation layer, 6 the damaged portion of a substrate, 7 the disconnected conductive line and substrate material, and 8 the disconnected portion of the unselected conductive line, respectively.

First, FIG. 1A is a plan view illustrating alignment of the fuse conductive line and irradiation of the laser beam for repairing, according to a prior art, FIG. 1B is a cross-sectional view illustrating alignment of the fuse conductive line and the irradiation of the laser beam for repairing, according to a prior art. Here, the isolation layer 5 is deposited on the fuse conductive line 1, whose deposited thickness is approximately 1 µm. Therefore, the laser used for repairing should have an appropriate energy level which enables the fuse conductive line to be disconnected electrically without doing any damage to the underlayer.

However, the fuse conductive line, having the element isolation layer formed thereon as described above, requires a laser beam with high energy so that it will be difficult to cut the fuse conductive line, and as shown in FIGS. 2A to 2C, results in a disconnection of the fuse conductive line which is not selected and damage of underlying substrate due to no process margin. FIG. 2A is a plan view of a damaged substrate due to the high power of a laser, FIG. 2B is a cross-sectional view of a damaged substrate due to the high power of the laser, and FIG. 2C is a plan view illustrating the disconnected state of the fuse conductive line which is not selected due to misalignment of the laser beam.

Moreover, in the practical repairing process, the adjustment of the energy of the laser beam appropriately is difficult since the disconnection of the fuse conductive line and the damage of the substrate is judged only by discriminating with a naked eye using a microscope.

SUMMARY OF THE INVENTION

It is the object of the present invention to provide a method for repairing a defect-generated cell using a laser, which having a process margin to disconnect a selected fuse conductive line efficiently, in the case where the spot size of the laser beam is much larger than the width of the fuse conductive line, or the laser beam is misaligned.

To this end, the present invention provides a method for repairing a defect-generated cell using a laser for disconnecting a defect-generated portion of a fuse conductive line in a fabricating process of semiconductor integrated circuits, characterized in that the insulation layer on a fuse conductive line is isotropically etched partially to a predetermined thickness in order to refract laser beam incident to the defect-generated portion of the fuse conductive line.

BRIEF DESCRIPTION OF THE DRAWINGS

The above and other objects, features and advantages of the present invention will be clearly understood from the following detailed description taken in conjunction with the accompanying diagrams, in which.

DESCRIPTION OF THE PREFERRED EMBODIMENTS

The preferred embodiment of the present invention will be described below with reference to the accompanied drawings.

Figure 1A:
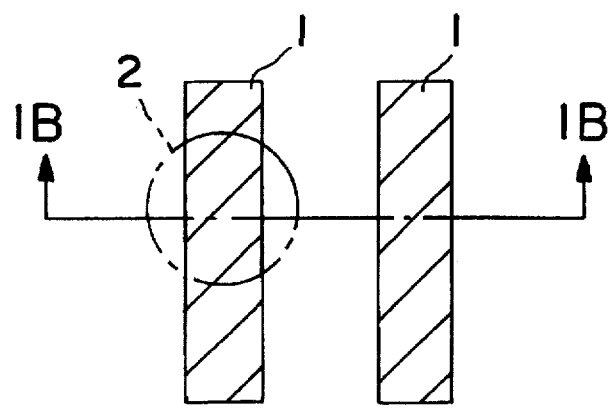
FIG. 1A is a plan view illustrating alignment of the fuse conductive line and irradiation of the laser beam for repairing, according to a prior art.
Figure 1B:
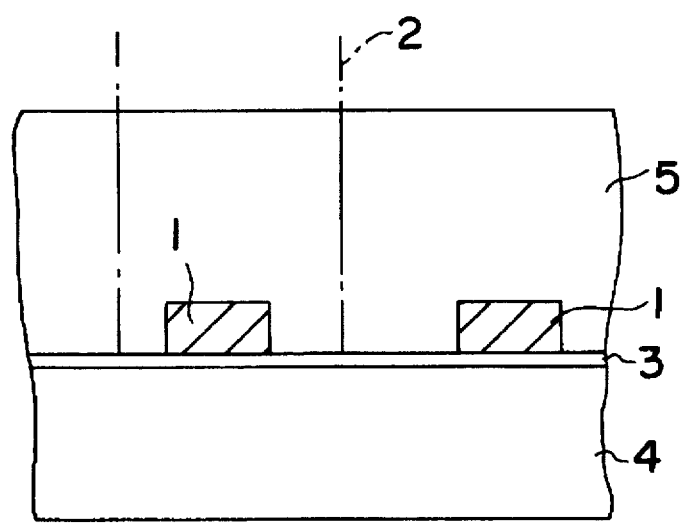
FIG. 1B is a cross-sectional view illustrating alignment of the fuse conductive line and irradiation of the laser beam for repairing, according to a prior art.
Figure 2A:
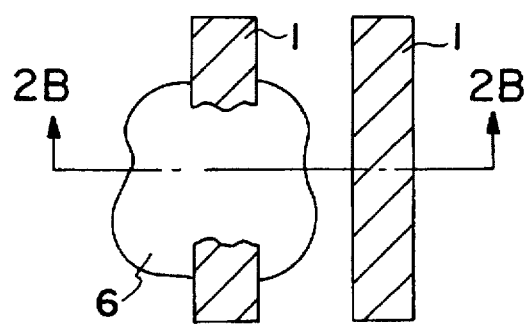
FIG. 2A is a plan view of a damaged substrate due to the high power of a laser.
Figure 2B:
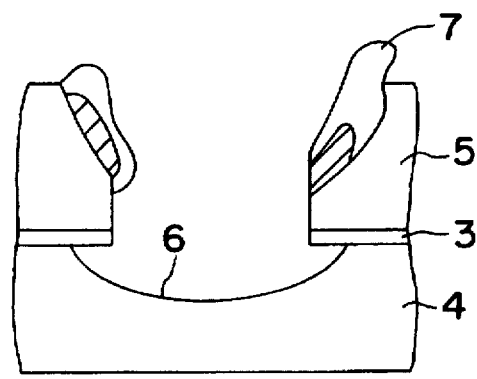
FIG. 2B is a cross-sectional view of damaged substrate due to the high power of a laser.
Figure 2C:
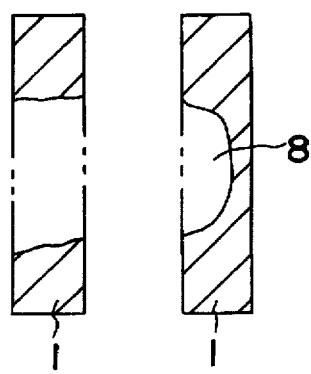
FIG. 2C is a plan view illustrating a disconnected state of the fuse conductive line which is not selected due to misalignment of the laser beam.
Figure 3A:
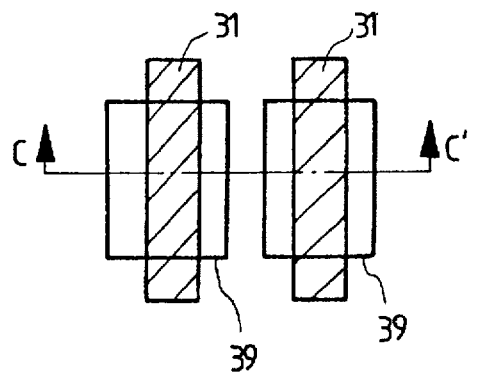
FIG. 3A is a plan view illustrating a state of repair mask placed on the fuse conductive line, according to an embodiment of the present invention.
Figure 3B:
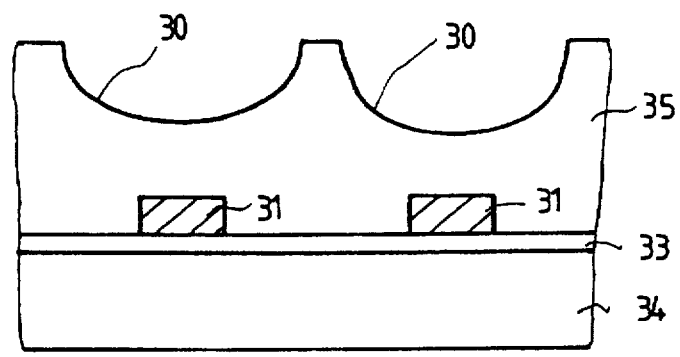
FIG. 3B is a cross-sectional view illustrating a state of insulation layer after the partial etching in FIG. 3A.

FIG. 3A is a plan view illustrating a state of repair mask placed on the fuse conductive line, according to an embodiment of the present invention, FIG. 3B is a cross-sectional view illustrating the state of an insulation layer after a partial etching in FIG. 3A. As shown in figures, the thick insulation layer 35 is etched partially by an isotropic etching method to a predetermined thickness using the repair mask 39 on the aligned fuse conductive line 31 to render the profile of the partially etched insulation layer as an isotropic shape, so that the thickness of the insulation layer on the fuse conductive line will be relatively thin.

Figure 4:
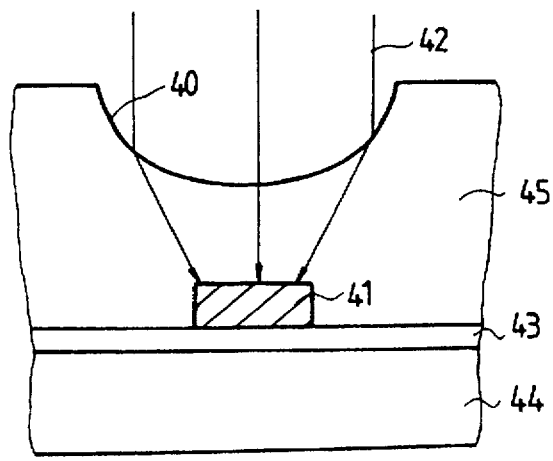
FIG. 4 is a cross-sectional view of incidence direction of the laser beam in FIG. 3B.

In this case, it is possible to easily carry out the discrimination with a naked eye using a microscope after the repairing process, and as shown in FIG. 4 illustrating incidence direction of the laser beam, incident laser beam is refracted and can be transferred to the fuse conductive line 41, even in the case where the spot size of the laser beam in much larger than the width of the fuse conductive line and the laser beam is misaligned.

Accordingly, by virtue of the present invention, it is possible to increase the process margin of the repairing process using a laser and to reduce the generation of particles in the packaging process, such as succeeding passivation process because the remnant on the fuse conductive line remains on the partially etched portion after the repairing process.

What is claimed is:

1. A method for repairing a defect-generated cell using a laser beam for disconnecting a defect-generated portion of a fuse conductive line in the fabricating process of semiconductor integrated circuits, characterized in that an insulation layer on the fuse conductive line is isotropically etched forming a concave recess in order to refract the laser beam upon the defect-generated portion of the fuse conductive line.

2. A method for repairing a defect-generated cell according to claim 1 wherein the insulation layer is etched to a first thickness.

* * * * *